(12) United States Patent
Davenport et al.

(10) Patent No.: US 6,404,296 B1
(45) Date of Patent: Jun. 11, 2002

(54) AMPLITUDE-LEVELED WIDE-RANGE SOURCE-COUPLED OSCILLATOR

(75) Inventors: William H. Davenport, Hillsboro; Tyler Bowman, Sherwood, both of OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 09/730,031

(22) Filed: Dec. 4, 2000

(51) Int. Cl.[7] .................. H03K 3/00; H03K 3/282
(52) U.S. Cl. .............. 331/111; 331/113 R; 331/109; 331/177 R; 331/144
(58) Field of Search .................. 331/109, 111, 331/113 R, 144, 177 R

(56) References Cited

U.S. PATENT DOCUMENTS 6,201,450 B1 * 3/2001 Shakiba et al. .............. 331/111

* cited by examiner

Primary Examiner—Arnold Kinkead
(74) Attorney, Agent, or Firm—Skjerven Morrill LLP

(57) ABSTRACT

A source-coupled oscillator contains two main MESFETs which supply current to respective loads and which have sources connected through a capacitor. Each of the main MESFETs is supplied with a constant current which can be adjusted to vary the frequency of the oscillator. The output signals are derived from the voltage across the loads. The oscillator also contains two differential pairs of MESFETs that change state as the main MESFETs are turned on and off and are connected so as to switch current into one or the other of the loads. Each of the differential pairs is supplied with a constant current. The currents supplied by the differential pairs act as compensating currents and are adjusted so that when the currents through the two main MESFETs are changed to vary the frequency of the oscillator, the total current through the loads remains constant. In this manner, the amplitude of the output signal can be maintained at a substantially constant level as the frequency of the oscillator is adjusted through a wide range.

15 Claims, 2 Drawing Sheets

AMPLITUDE-LEVELED WIDE-RANGE SOURCE-COUPLED OSCILLATOR

FIELD OF THE INVENTION

This invention relates to electronic oscillators and, in particular, to a source-coupled oscillator capable of operating over an exceptionally wide frequency range with a minimal change in amplitude.

BACKGROUND OF THE INVENTION

FIG. 1 is a circuit diagram of a known source-coupled oscillator 10, which uses AC source-coupled differential-current switches (MESFETs X1, X2) to steer current to loads L1, L2. The voltages at loads L1, L2 are buffered by source-follower MESFETs X3, X4, level shifted by level shift devices Z1, Z2, and cross-coupled to the gates of the opposite ones of MESFETs X1, X2, respectively. Constant current source S5 provides a current for source-follower X3 and level shift device Z1, and constant current source S6 provides a current for source-follower X4 and level shift device Z2. Level shift devices Z1 and Z2 can be diodes, batteries or any other component capable of inserting a constant voltage drop into the circuit.

The frequency of oscillator 10 is proportional to the size of the currents I1, I2 supplied by current sources S1, S2, respectively, and inversely proportional to the capacitance of capacitor C1. The period of the oscillations (T) can be expressed by the relationship:

$$T \sim (V/I) \times C1$$

where V is the signal swing ((I1+I2)×Lx), I is the magnitude of the currents I1, I2, and C1 is value of capacitor C1. This is a capacitive slew rate relationship regulating the discharge time of capacitor C1 by the currents I1, I2. Since, in this example, I1 is equal to I2, the duty cycle of the oscillations is 50%. If I1 is not equal to I2, then the duty cycle of the oscillation will be equal to I1/I2.

Oscillator 10 is essentially controlled by positive feedback paths which run: (a) from node 1 at the terminal of load L1, through source-follower MESFET X3 and level shift device Z1 to the gate of MESFET X2; and then from node 2 at the terminal of load L2, through MESFET X4 and level shift device Z2 to the gate of MESFET X1; and (b) from node 2 at the terminal of load L2, through source-follower MESFET X4 and level shift device Z2 to the gate of MESFET X1, and then from node 1 through source-follower MESFET X4 and level shift device Z1 to the gate of MESFET X2. The net result is that an increase in the current through MESFET X1 tends to turn MESFET X1 further on, and an increase in the current through MESFET X2 tends to turn MESFET X2 further on.

When oscillator 10 is initially turned on, noise fluctuations cause the currents through MESFETs X1 and X2 to vary (i.e., because of noise, it is impossible for the currents through MESFETs X1 and X2 to remain perfectly constant). Assume that initially the current through MESFET X1 is increasing. With the current through MESFET X1 and load L1 is increasing, the voltage at node 1 falls. This falling voltage is coupled through source-follower MESFET X3 and through level shift device Z1 to the gate of MESFET X2. Since in this embodiment MESFETs X1 and X2 are N-channel devices, the effect of lowering the voltage at the gate of MESFET X2 is to reduce the source-to-gate voltage $V_{gs}$ of MESFET X2, thereby reducing the current through MESFET X2. As the current through MESFET X2 becomes smaller, the voltage at node 2 rises. This increasing voltage is coupled through source-follower MESFET X4 and level shift device Z2 to the gate of MESFET X1. This increases $V_{gs}$ in MESFET X1 and further increases the size of the current through MESFET X1.

Capacitor C1 transmits the voltage at the source of MESFET X1 to the source of MESFET X2, following the normal capacitive lag. As MESFET X1 turns on, the voltage at its source rises, biasing the left side of capacitor C1 positively. This rising voltage is transmitted, to the source of MESFET X2 and reinforces the reduction of $V_{gs}$ in MESFET X2. The right side of capacitor C1 is biased negatively.

This process continues until MESFET X1 is fully turned on and MESFET X2 is fully turned off. The circuit is now halfway through one cycle of oscillation. With MESFET X2 off, current source S2 draws current from the right side of capacitor C1. This starts to pull the voltage at the source of MESFET X2 down, increasing $V_{gs}$ in MESFET X2 and beginning to turn MESFET X2 on. As the current through MESFET X2 increases, the voltage at node 2 begins to fall, and this falling voltage is transmitted through source-follower MESFET X4 and level shift device Z2 to the gate of MESFET X1. This reduces the $V_{gs}$ of MESFET X1 and begins to turn MESFET X1 off. As the current through MESFET X1 decreases, the voltage at node 1 rises. This rising voltage is transmitted through source-follower X3 and level shift device Z1 to the gate of MESFET X2, further increasing the $V_{gs}$ of MESFET X2. At this point in the cycle, the increasing current through MESFET X2 begins to charge the right side of capacitor C1. This increasing voltage is transmitted to the left side of capacitor C1, further reducing the $V_{gs}$ of MESFET X1. The process continues until MESFET X1 is fully turned off and MESFET X2 is fully turned on, completing one full cycle of oscillation. The current I1 then starts to discharge the left side of capacitor C1, and the cycle is repeated.

In this conventional oscillator, the frequency is set by adjusting the magnitude of the currents I1 and I2 and/or the size of capacitor C1. The frequency increases as I1 and I2 increase and decreases as I1 and I2 decrease. A problem with this arrangement, however, is that as the size of I1 and I2 varies, the amplitude of the output signal also varies. For example, the signal swing at node 1 is directly related to the magnitude of (I1+I2)×L1), and the signal at node 1 is translated through source-follower MESFET X3 and level shift device Z1 to become the OUT1 signal. Likewise, the signal swing at node 2 directly related to the magnitude of (I2+I1)×L2, and the signal at node 2 is translated through source-follower MESFET X4 and level shift device Z2 to become the OUT2 signal. Thus increasing (or decreasing) the frequency of oscillator 10 has the undesirable side effect of also increasing (or decreasing) the amplitude of the output signal. Increasing amplitude means increasing output slew times, and decreasing amplitude means decreasing output slew times. Therefore, as the current is increased to increase the frequency of the oscillator (or decreased to decrease the frequency of the oscillator), the change in the voltage swing that the circuit must slew through is acting in opposition to the desired change in frequency. This limits the oscillator to a much narrower tuning range than would be assumed from the relationship $T \sim (V/I) \times C1$. The gain issue becomes a problem as the current is reduced to a level below that at which the source-coupled amplifier's gain drops below one. The problem of varying amplitude also creates issues with available bias and supply constraints.

There is, accordingly, a real need for a source-coupled oscillator that is able to operate at a substantially fixed amplitude over a wider frequency range than a conventional oscillator of the kind described above.

SUMMARY OF THE INVENTION

In accordance with this invention, a source-coupled oscillator includes a first MESFET connected with a first load in a first current path and a second MESFET connected with a second load in a second current path. The first MESFET is supplied with a constant current (I1) and the second MESFET is supplied with a constant current (I2). A capacitor is connected between a source of the first MESFET and a source of the second MESFET. A first feedback path is connected between the first load and a gate of the second MESFET; and a second feedback path is connected between the second load and a gate of the first MESFET.

The oscillator also two pairs MESFETs, each of the differential pairs being supplied with a constant current. In the first differential pair, one of the MESFETs is connected to switch a current into the firs t current path and ha s a gate that is coupled to the second feedback path; the second MESFET in the first differential pair is connected to switch a current into the second current path and has a gate connected to the first current path. In the second differential pair, one of the MESFETs is connected to switch a current into the first current path and has a gate that is coupled to the second current path; the second MESFET in the second differential pair is connected to switch a current into the second current path and has a gate connected to the first feedback path. The first differential pair is supplied with a constant current (I3), an d the second differential pair is supplied with a constant current (I4).

The frequency of the oscillator can be adjusted by changing the size of the currents I1 and I2, which flow through the first and second MESFETs. To maintain the amplitude of the output signal constant, the constant currents I3 and I4 are adjusted such that the sum of I2, I2, I3 and I4 remains the same. I3 and I4 act as compensating currents to ensure that th e total current flowing through the loads remains constant.

Using the source-coupled oscillator of this invention, the frequency c an b e changed over very broad ranges while maintaining the amplitude of the output signal substantially constant.

DESCRIPTION OF THE INVENTION

Figure 1:
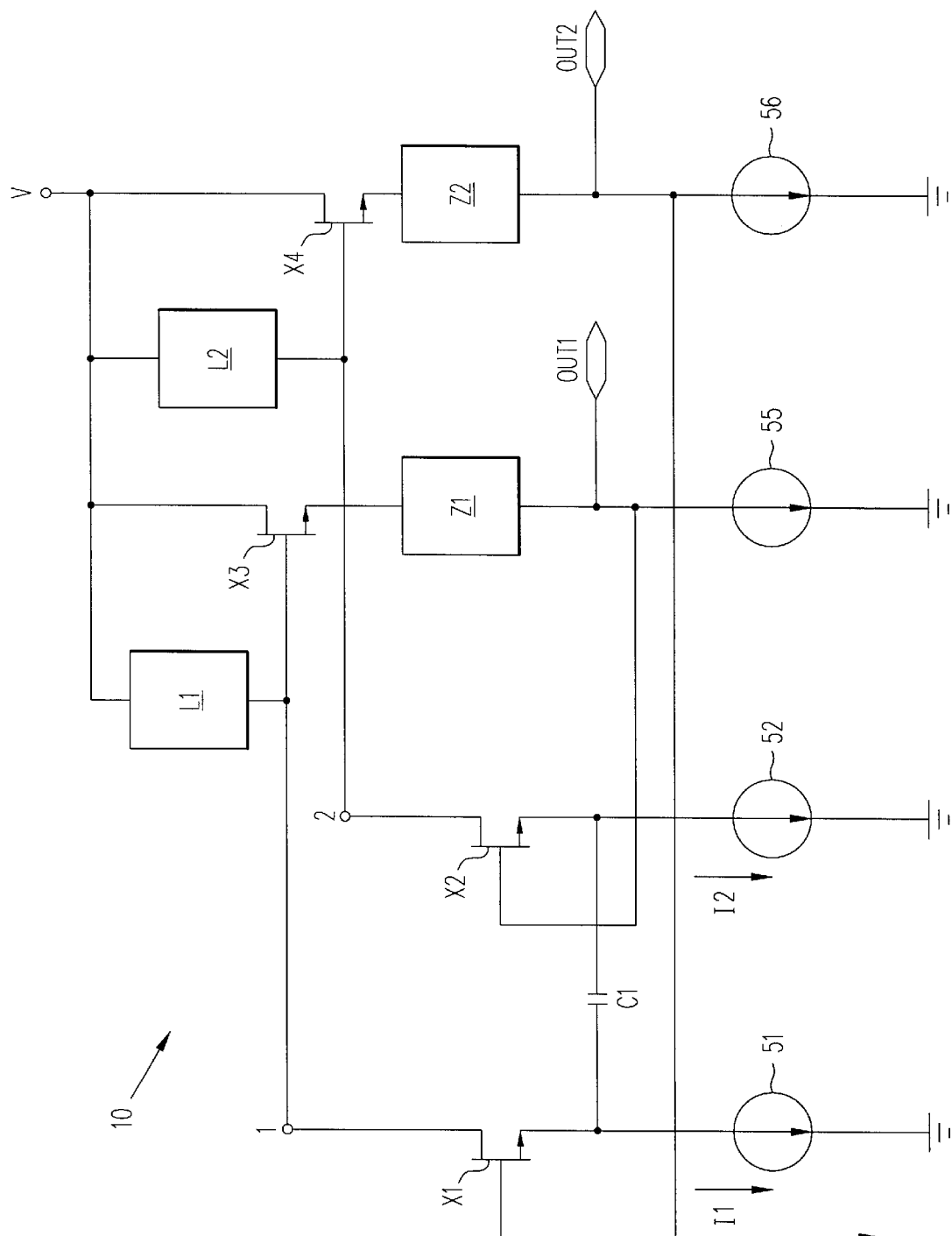
FIG. 1 is a schematic circuit diagram of a convention al source-coupled oscillator.
Figure 2:
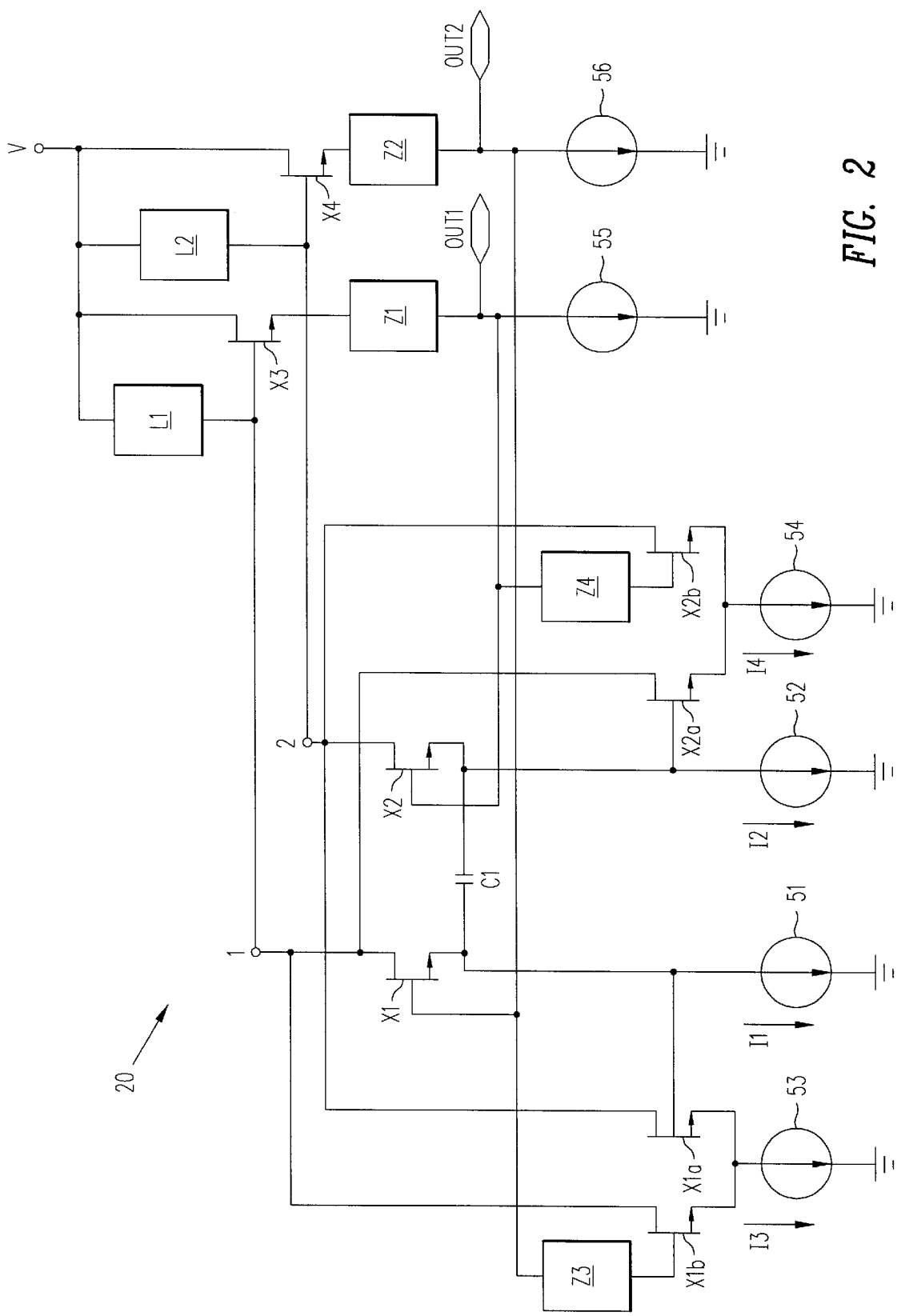
FIG. 2 is a schematic circuit diagram of a source-coupled oscillator in accordance with the invention.

FIG. 2 shows a circuit diagram of an oscillator 20 in accordance with this invention. The components that are the same as those in oscillator 10 have the same reference numerals. Two additional current sources, S3 and S4, supply constant currents I3 and I4, respectively. I3 is divided between a differential pair of MESFETs X1*a* and X1B, and I4 is divided between a differential pair of MESFETs, X2*a* and X2*b*. The currents through MESFETs X1*b* and X2*a* are summed with the current through MESFET X1 at node 1. The currents through MESFETs X1*a* and X2*b* are summed with the current through MESFET X2 at node 2.

As described above, the frequency of oscillator 20 is determined by currents I1 and I2, which are the currents through MESFETs X1 and X2, respectively. In other words, the frequency of oscillator 20 can be varied by adjusting the size of currents I1 and I2. In oscillator 10, this has the undesirable side effect of varying the size of the currents through loads L1 and L2, which in turn changes the amplitude of the output signal.

In oscillator 20, the amplitude of the output signals OUT1 and OUT2 is maintained at a constant level by ensuring that, as currents I1 and I2 are adjusted, the following relationship is maintained:

$$I1+I2+I3+I4=\text{Constant}$$

For example, if currents I1 and I2 are increased to increase the oscillation frequency, currents I3 and I4 are adjusted downward by an equal amount such that the sum of the currents (I1+I2+I3+I4) delivered to the loads L1 and L2 remains the same. Conversely, if currents I1 and I2 are decreased to decrease the oscillation frequency, currents I3 and I4 are adjusted upward by an equal amount. The MESFET pairs X1*a*, X1*b* and X2*a*, X2*b* operate as differential amplifiers which sense the decision thresholds of MESFETs X1 and X2, respectively, and then switch the compensating currents I3 and I4 into the summing nodes 1 and 2 at the loads L1 and L2. In this way, the currents being switched into the loads L1 and L2 remain constant as currents I1 and I2 are varied.

Level shift devices Z3 and Z4 are designed to match the gate-to-source voltages across MESFETs X1 and X2 when MESFETs X1 and X2 begin to turn on. The object of matching the gate-to-source voltages of MESFETs X1 and X2 with the voltages across level shift devices Z3 and Z4 is to ensure that the signals into the differential amplifier X1*a*, X1*b* and differential amplifier X2*a*, X2*b* do not have DC offset components. Offsets would normally be created if the gate-to-source voltage (Vgs) of MESFETs X1 and X2 at turn-on is something other than zero volts.

To understand the operation of oscillator 20, assume that initially MESFETs X1, X1*b* and X2*a* are turned on and MESFETs X2, X2*b* and X1*a* are turned off. Since MESFETs X1, X1*b* and X2*a* are supplying current to node 1, the voltage at node 1 is low, whereas, since MESFETs X2, X2*b* and X1*a* are blocking current to node 2, the voltage at node 2 is high. Source-follower MESFET X3 and level shift device Z1 buffer and level shift the low voltage at node 1 to the gate of MESFET X2; correspondingly, source-follower MESFET X4 and level shift device Z2 buffer and level shift the high voltage at node 2 to the gate of MESFET X1. This circuitry is identical to the positive feedback circuit in oscillator 10 described above. In this condition, the voltage across capacitor C1 is such that MESFET X2 is off and not conducting. Thus the current I2 discharges the capacitor C1, reducing the voltage at the source of MESFET X2.

As the voltage at the source of MESFET X2 falls, eventually it reaches the point where MESFET X2 begins to turn on. Since the voltage across level shift device Z4 matches the Vgs of MESFET X2 at threshold, X2*b* also begins to turn on and X2*a* begins to turn off. Thus the effect is that the differential amplifier pair X2*a*, X2*b* begins to change state when the falling voltage at the source of MESFET X2 reaches the decision threshold of MESFET X2. Because of the cross-coupling between nodes 1 and 2 and the gates of MESFETs X1 and X2, MESFET X1 also begins to turn off and the voltage at node 1 begins to rise. The rising voltage at node 1 is level-shifted and coupled to the respective gates of MESFETs X2 and X2*b*, accelerating the turn-on condition of MESFETs X2 and X2*b*. The rising voltage at the gate of MESFET X2 causes the source of MESFET X2 and the right side of capacitor C1 to follow. The rising voltage at the right side of capacitor C1 is coupled through capacitor C1 to the left side of capacitor C1, aiding in the turn-off of MESFET X1, which further enforces the rising state of node 1.

Further, as MESFET X2 begins to turn on, the voltage at node 2 begins to fall. This falling voltage is buffered and level-shifted to the gate of MESFET X1b, and MESFET X1b begins to turn off. The rising voltage at the source of MESFET X1, coupled through capacitor C1 from the source of MESFET X2, is coupled to the gate of MESFET X1a, and MESFET X1a begins to turn on. Thus the differential amplifier pair X1a, X1b also begins to change state.

To summarize, when the voltage at the source of MESFET X2 falls below the threshold of MESFET X2 as a result of the discharging of capacitor C1 by current I2, both of the differential amplifier pairs X2a, X2b and X1 a, X1b begin to change state. As the source voltage of MESFET X2 continues to fall, this process continues, until both of the differential amplifier pairs X1a, X1b and X2a, X2b have completely changed state. The net result is that MESFETs X2, X2b and X1a turn on substantially simultaneously, feeding a total current equal to I2+I3+I4 to node 2 and through load L2. MESFETs X1, X1b and X2a turn off substantially simultaneously, cutting off a total current equal to I1+I3+I4 from node 1 and load L1. When MESFET X1 is completely off, the process is repeated in the opposite direction. The voltage at the source of MESFET X1 is pulled down as current I1 discharges capacitor C1, and the differential amplifier pairs X1a, X1b and X2a, X2b switch back to their original state. MESFETs X1, X1b and X2a turn on substantially simultaneously, feeding a total current equal to I1+I3+I4 to node 1 and through load L1. MESFETs X2, X2b and X1a turn off substantially simultaneously, cutting off a total current equal to I2+I3+I4 from node 2 and load L2. Thus, by properly adjusting the compensating currents I3 and I4 as currents I1 and I2 are varied to change the frequency, an output voltage signal having a constant amplitude can be obtained over a wide range of frequencies. Circuits according to his invention have been simulated, fabricated and measured over frequencies ranging from 10 MHz to 2 GHz, with substantially no change in output amplitude.

The embodiments described above are illustrative only and not limiting. Numerous alternative embodiments in accordance with this invention will be apparent to those skilled in the art. For example, while the embodiment described herein uses metal-semiconductor field-effect transistors (MESFETs), other types of FETs such as metal-oxide-silicon field-effect transistors (MOSFETs) and junction field-effect transistors (JFETs), and bipolar transistors, could also be used. All of these devices have two main, current-carrying terminals and a control terminal (the gate in FETs, the base in bipolar devices), which regulates the flow of current through the main terminals.

We claim:

1. A source-coupled oscillator comprising:
   a first transistor connected with a first load in a first current path, the first current path being supplied with a first constant current;
   a second transistor connected with a second load in a second current path, the second current path being supplied with a second constant current;
   a capacitor connected between a main terminal of the first transistor and a main terminal of the second transistor;
   a first feedback path connected between the first load and a control terminal of the second transistor;
   a second feedbak path connected between the second load and a control terminal of the first transistor;
   first differential pair comprising third and fourth transistors, the first differential pair being supplied with a third constant current, the third transistor being connected to switch a current into the first current path, the fourth transistor being connected to switch a current into the second current path; and a second differential pair comprising fifth and sixth transistors, the second differential pair being supplied with a fourth constant current. the fifth transistor being connected to switch a current into the first current path, the sixth transistor being connected to switch a current into the second current path.

2. A source-coupled oscillator comprising:
   a first transistor connected with a first load in a first current path, the first current path being supplied with a first constant current;
   a second transistor connected with a second load in a second current path, the second current path being supplied with a second constant current;
   a capacitor connected between a main terminal of the first transistor and a main terminal of the second transistor;
   a first feedback path connected between the first load and a control terminal of the second transistor;
   a second feedback path connected between the second load and a control terminal of the first transistor;
   a first differential pair comprising third and fourth transistors, the first differential pair being supplied with a third constant current, the third transistor being connected to switch a current into the first current path, the fourth transistor being connected to switch a current into the second current path, wherein a control terminal of the third transistor is coupled to a point on the second feedback path and a control terminal of the fourth transistor is coupled to a point on the first current path; and
   a second differential pair comprising fifth and sixth transistors, the second differential pair being supplied with a fourth constant current, the fifth transistor being connected to switch a current into the first current path, the sixth transistor being connected to switch a current into the second current path.

3. The source-coupled oscillator of claim 2 wherein a control terminal of the fifth transistor is coupled to a point on the second current path and a control terminal of the sixth transistor is coupled to a point on the first feedback path.

4. The source-coupled oscillator of claim 1 or 2 wherein the first feedback path includes a first buffer and a first level shift device.

5. The source-coupled oscillator of claim 4 wherein the first buffer comprises a first source-follower transistor.

6. A source-coupled oscillator comprising:
   a first transistor connected with a first load in a first current path, the first current path being supplied with a first constant current;
   a second transistor connected with a second load in a second current path, the second current path being supplied with a second constant current;
   a capacitor connected between a main terminal of the first transistor and a main terminal of the second transistor;
   a first feedback path connected between the first load and a control terminal of the second transistor;
   a second feedback path connected between the second load and a control terminal of the first transistor;
   a first differential pair comprising third and fourth transistors, the first differential pair being supplied with a third constant current, the third transistor being connected to switch a current into the first current path, the fourth transistor being connected to switch a current into the second current path;
   a second differential pair comprising fifth and sixth transistors, the second differential pair being supplied with a fourth constant current, the fifth transistor being connected to switch a current into the first current path, the sixth transistor being connected to switch a current into the second current path; and the first feedback path includes a first buffer and a first level shift device and the first buffer and the first level shift device are supplied with a fifth constant current.

7. The source-coupled oscillator of claim 4 wherein the second feedback path includes a second buffer and a second level shift device.

8. A source-coupled oscillator comprising:

a first transistor connected with a first load in a first current path, the first current path being supplied with a first constant current;

a second transistor connected with a second load in a second current path, the second current path being supplied with a second constant current;

a capacitor connected between a main terminal of the first transistor and a main terminal of the second transistor;

a first feedback path connected between the first load and a control terminal of the second transistor;

a second feedback path connected between the second load and a control terminal of the first transistor;

a first differential pair comprising third and fourth transistors, the first differential pair being supplied with a third constant current, the third transistor being connected to switch a current into the first current path, the fourth transistor being connected to switch a current into the second current path;

a second differential pair comprising fifth and sixth transistors, the second differential pair being supplied with a fourth constant current, the fifth transistor being connected to switch a current into the first current path, the sixth transistor being connected to switch a current into the second current path; and the second feedback path includes a buffer and a level shift device, and the buffer and the level shift device are supplied with a fifth constant current.

9. The source-coupled oscillator of claim 8 wherein the buffer comprises a source-follower transistor.

10. The source-coupled oscillator of claim 1 wherein each of the transistors comprises a MESFET.

11. The s source-coupled oscillator of claim 10 wherein each of the control terminals comprises a gate terminal.

12. The source-coupled oscillator of claim 11 wherein each of the main terminals comprises a source terminal.

13. A method of using the source-coupled oscillator comprising:

a first transistor connected with a first load in a first current path, the first current path being supplied with a first constant current;

a second transistor connected with a second load in a second current path, the second current path being supplied with a second constant current;

a capacitor connected between a main terminal of the first transistor and a main terminal of the second transistor, first feedback path connected between the first load and a control terminal of the second transistor;

a second feedback path connected between the second load and a control terminal of the first transistor;

a first differential pair comprising third and fourth transistors, the first differential pair being supplied with a third constant current, the third transistor being connected to switch a current into the first current path, the fourth transistor being connected to switch a current into the second current path;

a second differential pair comprising fifth and sixth transistors, the second differential pair being supplied with a fourth constant current, the fifth transistor being connected to switch a current into the first current path, the sixth transistor being connected to switch a current into the second current path;

operating the oscillator at a first frequency, the sum of the respective values of the first, second, third and fourth constant currents equaling a constant; and changing the value of at least one of the first and second constant currents such that the oscillator operates at a second frequency, and adjusting at least one of the third and fourth currents such that the sum of the first, second, third and fourth currents equals the constant.

14. The method of claim 13 wherein an amplitude of an output signal of the source-coupled oscillator remains substantially the same when the oscillator is operating at the first and second frequencies, respectively.

15. A source-coupled oscillator comprising:

first and second transistors connected into first and second current paths, respectively, the first current path being supplied by a first current source, the second current path being supplied by a second current source;

a capacitor connected between respective main terminals of the first and second transistors;

a first differential pair connected to a third current source and having a first output connected to the first current path and a second output connected to the second current path; and a second differential pair connected to a fourth current source and having a third output connected to the first current path and a fourth output connected to the second current path.

* * * * *